(12) United States Patent
Yi et al.

(10) Patent No.: US 7,435,098 B2
(45) Date of Patent: Oct. 14, 2008

(54) ELECTRICAL INTERCONNECTION BETWEEN MULTIPLE PRINTED CIRCUIT BOARDS

(75) Inventors: Chong Yi, Harrisburg, PA (US); Scott K. Mickievicz, Elizabethtown, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 242 days.

(21) Appl. No.: 11/504,337

(22) Filed: Aug. 15, 2006

(65) Prior Publication Data

US 2008/0045087 A1    Feb. 21, 2008

(51) Int. Cl.
*H01R 12/00*    (2006.01)
(52) U.S. Cl. .............................. 439/65; 439/61; 439/67
(58) Field of Classification Search ............. 439/61–67, 439/259, 594, 752.5, 637
See application file for complete search history.

(56) References Cited

U.S. PATENT DOCUMENTS

| | | | | |
|---|---|---|---|---|
| 3,853,379 A | * | 12/1974 | Goodman et al. | 439/261 |
| 6,132,222 A | * | 10/2000 | Wang et al. | 439/70 |
| 6,334,784 B1 | * | 1/2002 | Howard | 439/260 |
| 6,508,675 B1 | * | 1/2003 | Korsunsky et al. | 439/637 |
| 6,572,396 B1 | * | 6/2003 | Rathburn | 439/260 |
| 6,923,655 B2 | * | 8/2005 | Korsunsky et al. | 439/65 |

* cited by examiner

*Primary Examiner*—Briggitte R Hammond
(74) *Attorney, Agent, or Firm*—Wei Te Chung

(57) ABSTRACT

An electrical interconnection system includes a stationary board (20, 20'), a removable board (30, 30'), an electrical connector (1, 1') interconnecting the two boards, and an actuator (90, 90'). The electrical connector has a plurality of contacts (11) received in a dielectric housing (10), each comprising a first contact end (11a) contacting with the stationary board and a second contact end (11b) contacting with the removable board. The actuator includes an actuation plate (12, 12') assembled on the connector and a driving member (31, 31') mounted on the removable board. The driving member cooperates with and exerts a force on the actuation plate to drive the contacts move to electrically interconnect the two boards.

17 Claims, 10 Drawing Sheets

ELECTRICAL INTERCONNECTION BETWEEN MULTIPLE PRINTED CIRCUIT BOARDS

BACKGROUND OF THE INVENTION

1. Field of the Invention

The present invention generally relates to an electrical interconnection, and more particularly to an interconnection within an electrical system in which a plurality of motherboards and a plurality of daughter boards are installed and arranged in a matrix form.

2. Description of Related Art

Various electronic systems, especially a telecommunication system, router, server and switch, comprise a wide array of components mounted on printed circuit boards, such as daughter boards and motherboards. The mother board to which the daughter boards are connected are generally referred to as backplane as it is stationary. Connectors used to assemble the daughterboards, which are removable, to the motherboards are referred to as backplane connectors. The mother board and the daughter board are interconnected by the connectors so as to transfer signals and power throughout the systems.

Typically, the motherboard, or backplane, is a printed circuit board that is mounted in a server or a switch and is provided with a plurality of backplane connectors. Multiple daughterboards are also each provided with a mating connector and then removeably plugged into the connectors on the backplane. All the daughterboards are interconnected to the backplane, the daughterboards are interconnected through the backplane and are arranged parallel to each other.

However, connecting the daughterboards via the backplane leads to the potential for signal interference. Because the daughterboards are all connected via the backplane, signal strength may be attenuated as signals travel through the backplane. In general, signals passing between two daughterboards pass through at least a first connector pair between a first daughter board and the backplane, and a second connector pair between the backplane and a second daughter board. In general, the signal passes through totally two pairs of mated connectors, and each time the signal is attenuated as it passes.

Generally, the arrangement between the backplane and the daughter board can be referred to as a "TTTT" type viewed from a top, i.e. the backplane is arranged in a horizontal direction, while the daughter board is arranged in a position perpendicular to the backplane. In some cases, both sides of the backplane are all provided with connectors for assembling the daughterboards from both sides. This arrangement can be referred to as a "++++" type viewed from atop. In this arrangement, the daughterboards arranged in both sides are in communication with each other through the motherboard, i.e. centerplane.

Many connectors have been provided for achieving such arrangement. U.S. Pat. No. 5,993,259 (the '259 patent) issued to Stokoe et al. discloses an electrical connector of such application. The connector disclosed in the '259 patent includes a plurality of modularized wafers bounded together. As shown in FIG. 4 of the '259 patent, the terminals are stamped from a metal sheet and then embedded within an insulative material to form the wafer.

U.S. Pat. No. 6,083,047 issued to Paagman discloses an approach to make a high-density connector by introducing the use of printed circuit boards. Conductive traces are formed on surfaces of the printed circuit board in a mirror-image arrangement, typically shown in FIG. 12.

U.S. Pat. No. 6,267,604 issued to Mickievicz et al. discloses a similar configuration.

U.S. Pat. No. 5,356,301 issued to Champion et al. discloses a pair of back-to-back arranged plug connectors mounted on opposite sides of a motherboard via common contacts for respectively connecting with a receptacle connector mounted on a daughter board and a cable connector.

However, all connectors suggested above are all mounted on the backplane or centerplane. As it is well known that if the centerplane can be eliminated such that the daughterboards can be directly interconnected with each other, then the signal attenuation as well as the interference can be largely reduced. However, none of the connectors provided yet meets such a requirement.

U.S. Pat. No. 6,540,522 (the '522 patent) issued to Sipe sheds light on eliminating the centerplane, i.e. two daughterboards can be interconnected orthogonally, as clearly shown in FIG. 9. This is really a significant technical advance.

However, the signal still travels a long distance from one end of a first connector on a first circuit board, to a second connector on a second circuit board. This signal attenuation is still left unsolved. On the other hand, all these above mentioned connectors could be mounted on a single side and along an edge of the motherboard as well as the daughterboards. As shown in FIG. 9 of the '522 patent, it is impossible to install a second set connectors on the opposite side of the boards.

Traditionally, if a contact defines a longitudinal direction, then a mating direction of an electrical component, i.e. a mating contact of a complementary connector or a conductive pad of a printed circuit board has to be the same direction as the contact. Before the present invention, it is impossible to insert a card into a card-edge connector where the insertion direction of the card is orthogonal to the contact within the connector. If the contacts are not well arranged, the insertion of the card will collapse the contacts within the connector. The contacts have to be retracted behind a mating face of the connector during the insertion of the card, and then extend beyond the mating face after the card arrives to its final position. None of the existing connectors meets such a requirement.

For example, U.S. Pat. No. 6,508,675, assigned to the same assignee with this patent application, discloses a configuration providing the shortest electrical path between two printed circuit boards. It can be easily appreciated, as shown in FIGS. 1 and 2, that if the printed circuit board is not inserted into a slot of a connector along a top-to-bottom direction, i.e. a vertical direction, viewed from the drawings, contact portions of contacts extending into the slot will surely be damaged by the insertion of the circuit board. As described, this is not a suitable configuration for direct daughtercard-to-daughtercard connections.

In order to let the circuit board be inserted into the slot from a direction other than the top-to-bottom direction, a mechanism has to be invented to control the contact such that the contact is retracted behind the mating face when the printed circuit board is inserted and extends over the mating face after the printed circuit board is finally positioned.

The present invention aims to provide an electrical connector for interconnecting multiple printed circuit boards to solve the above-mentioned problems.

BRIEF SUMMARY OF THE INVENTION

Accordingly, it is an object of the present invention to provide an electrical interconnection system which allows for individual cards to disconnect from each other without disengaging entire row or column of connectors.

It is another object of the present invention to provide an electrical interconnection system which is easily assembled and operated.

In order to achieve the objects set forth, an electrical interconnection system in accordance with the present invention comprises a first printed circuit board, a second printed circuit board, a connector mounted on the first printed circuit board, and an actuator for facilitating the electrical connection between the first and the second printed circuit boards through the connector. The connector includes a plurality of signal and ground contacts arranged in rows and columns. Each contact has a first contact end contacting the first printed circuit board and a second contact end contacting the second printed circuit board. The actuator comprises an actuation plate assembled on the connector and a driving member mounted on the second printed circuit board. The driving member is configured as a cam defining therein a slot in which a post of the actuation plate slides. The cam member cooperates with and exerts a force on the actuation plate to drive the contacts to electrically interconnect the first and second printed circuit boards when the second printed circuit board is moved to interact with the first printed circuit board.

Other objects, advantages and novel features of the invention will become more apparent from the following detailed description of the present embodiment when taken in conjunction with the accompanying drawings.

BRIEF DESCRIPTION OF THE DRAWINGS

The foregoing summary, as well as the following detailed description of the preferred embodiments of the present invention, will be better understood when read in conjunction with the appended drawings. For the purpose of illustrating the invention, there is shown in the drawings, embodiments which are presently preferred. It should be understood, however, that the present invention is not limited to the precise arrangements and instrumentality shown in the attached drawings.

DETAILED DESCRIPTION OF THE PREFERRED EMBODIMENT

Figure 1:
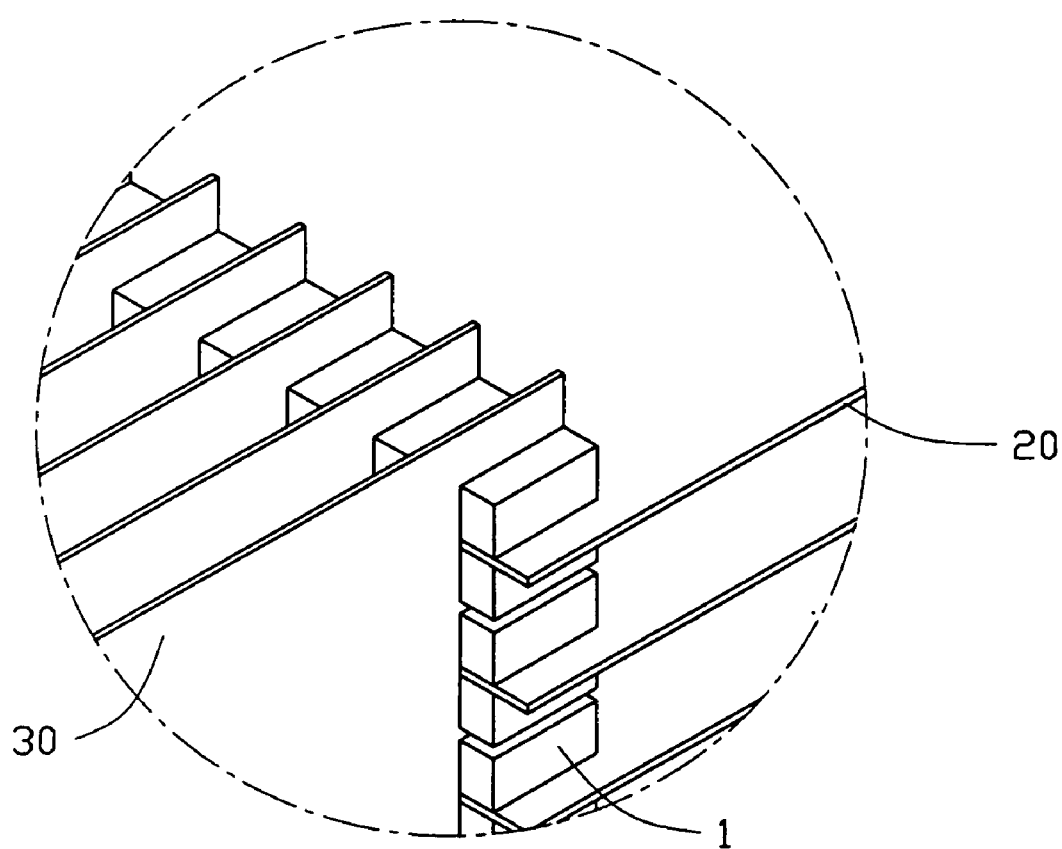
FIG. 1 is a perspective view of an electrical interconnection system in accordance with the present invention comprising a plurality of connectors interconnecting stationary boards and removable cards.

Reference will now be made to the drawing figures to describe the present invention in detail.

Figure 2:
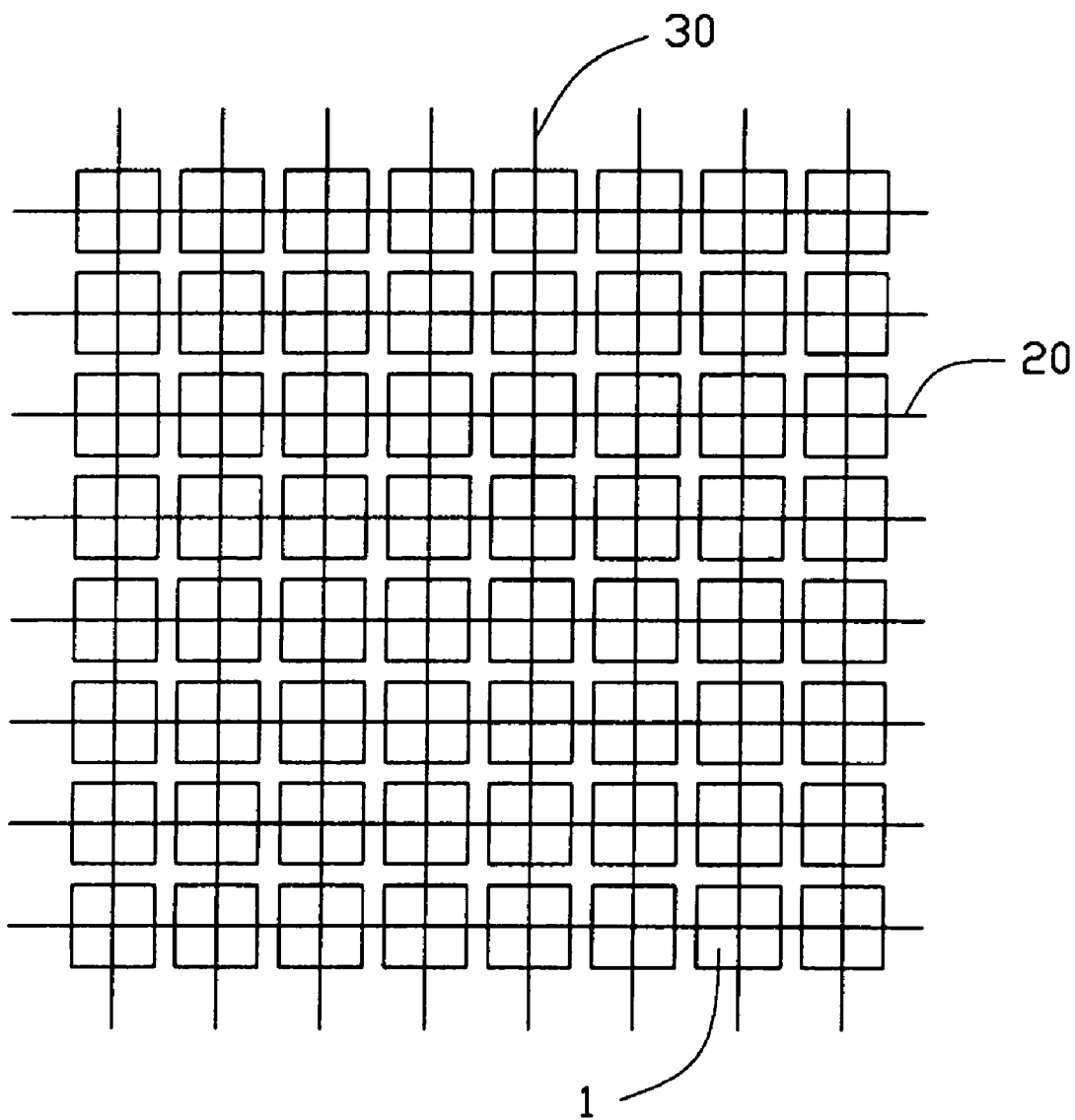
FIG. 2 a schematic view showing the electrical interconnection system.

Referring to FIGS. 1-2, a plurality of horizontal boards 20 and a plurality of vertical boards 30 are intersected with each other, which form a plurality of quadrants therebetween. For illustration purpose, the horizontal board 20 with the connectors mounted thereon is hereinafter referred to as "stationary card/board", while the vertical board 30 is referred to as "removable card/board". A plurality of electrical connectors 1 are employed in at least some of the quadrants to electrically connect the stationary card 20 and the removable card 30. It should be noted that a single member of either card type 20 or type 30 may be independently removable from the system.

One exemplary electrical connector 1 in according to a first embodiment of the present invention, is detailedly shown in FIGS. 3-6. The electrical connector 1 comprises a dielectric housing 10 defining a plurality of passageways 101 extending from a mounting face 10a to a mating face 10b thereof, and a plurality of conductive contacts 11 moveably received in the passageways 101. In the preferred embodiment, the contacts 11 include two rows of signal contacts 110 and one row ground contacts 111. That is, the contacts are arranged for differential pair application comprising two signal and one ground contacts.

Figure 5:
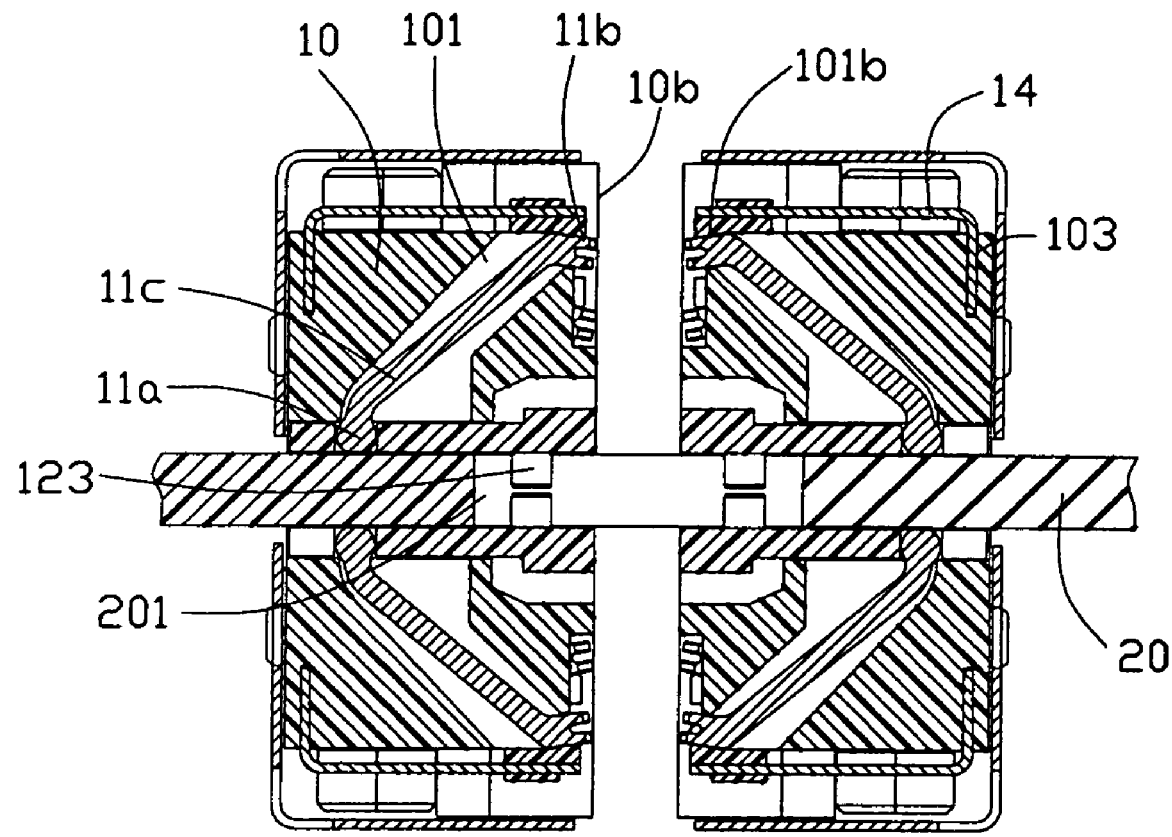
FIG. 5 is a cross-sectional view showing the connectors mounted on the stationary board.

Each contact 11 includes a first contacting end 11a extending beyond the mounting face 10a and a second contacting end 11b extending to the mating face 10b. An intermediate portion 11c connects the two contacting ends 11a, 11b. In the preferred embodiment, the structures of the signal and the ground contacts are same except that the intermediate portion of the ground contact is configured as a planar plate for shielding purposes known to the people in the art. The corresponding passageways 101 are designed to have open ends 101a, 101b opened to the mounting and mating faces 10a, 10b for respective first and second contacting ends 11a, 11b being received and moving therein. According to a preferred embodiment, the contact 11 is preferable rigidness or less flexibility. The physical property makes the contact 11 easy to move within the passageway 101 when an external force is exerted to the contact 11. As illustrated in FIG. 5, the first contacting end 11a is configured as a planar round head, while the second contacting end 11b is configured to have a pair of fingers bent perpendicularly to the planar round head for wiping purpose during insertion of the removable card 30. Understandably, configurations of the contacting ends can be optionally selected during application.

The electrical connector 1 includes an actuation plate 12 attached to the mounting face 10a. The actuation plate 12 extends along a lengthwise direction of the connector 1 and defines thereon an array of holes 120 for retaining corresponding round heads of the first contacting ends 11a therein to thereby move together with the actuation plate 12 during the insertion of the removable card 30. In the preferred embodiment, the actuation plate 12 is made from insulative material. While, other structures of the actuation plate 12 are also available, which can engage and move together with the first contacting ends 11a. For example, the actuation plate could comprise a planar metal body and a dielectric boot over-molded on the metal body. The details of this alternative structure of the actuation plate can be found in U.S. Pat. Nos. 6,923,655, 6,918,775, and 6,866,518, which are assigned to the same assignee of the present invention. The actuation plate 12 comprises a post 123 projecting perpendicularly therefrom and extending into a cutout 201 (FIG. 3) of the stationary card 20. The post 123 cooperates with a cam member 31 of the removable card 30 in order to establish an electrical connection between the two orthogonal cards 20, 30, which will be detailedly described hereinafter. Moreover, more than one array of holes can be defined in the actuation plate according to the application requirements.

The electrical connector 1 further includes a plurality of biasing springs 14. Each biasing spring 14 comprises an anchor 141 securely retained in an anchoring slit 103 of the dielectric housing 10, a spring arm 142 extending from the anchor 141, and an insulator 143 connecting with a free end of the spring arm 142. The insulator 143 can be integrally formed with the spring arm 142, or can be firstly molded and then assembled to the spring arm 142. The plurality of biasing springs 14 can also be integrally formed as a single one according to the application requirement. The insulator 143 of the biasing spring 14 provides a biasing force to the second contacting end 11b of the contact 11 to thereby hold the actuator plate 12 and the contact 11 in position.

Figure 6:
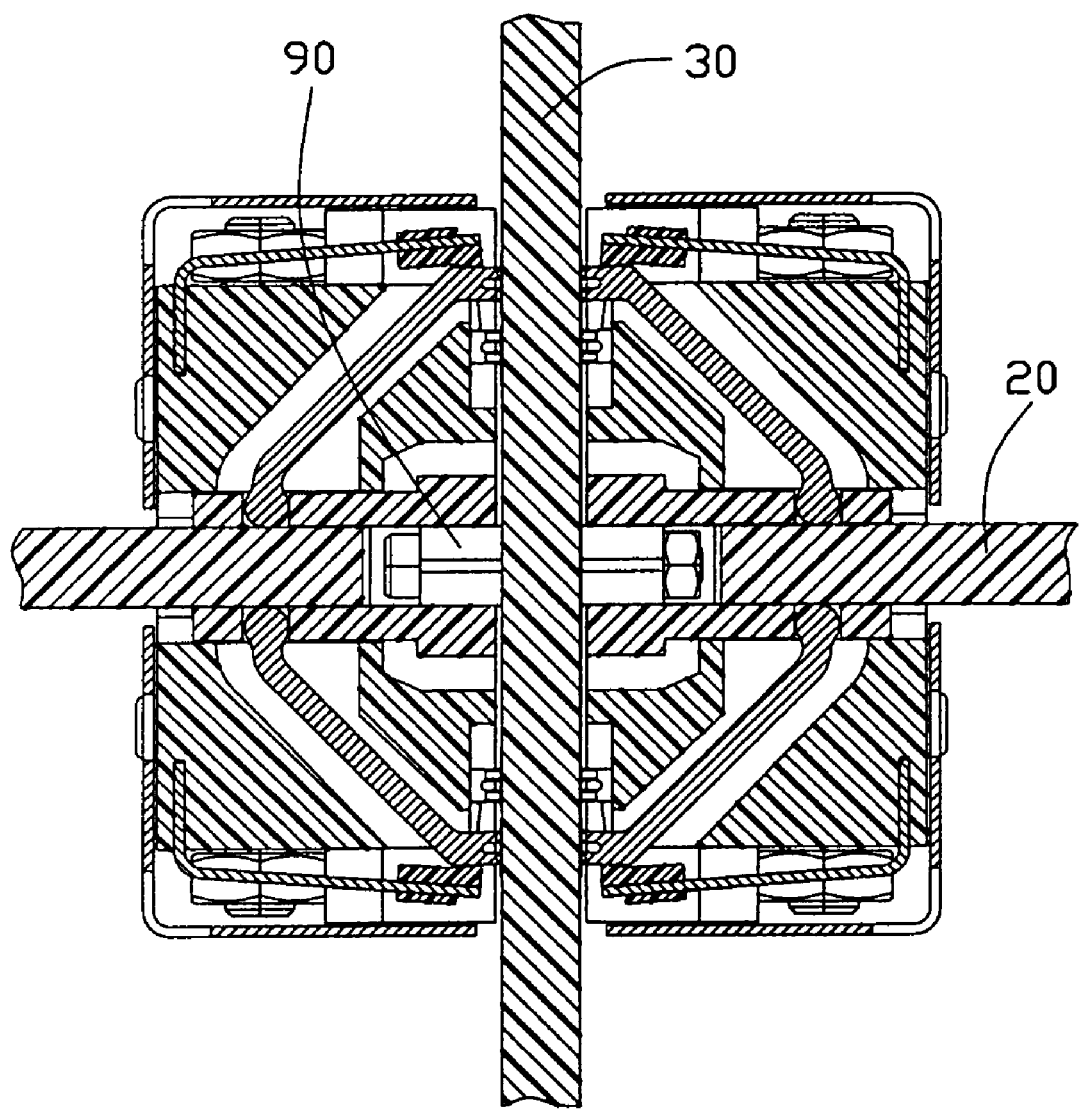
FIG. 6 is a view similar to FIG. 5 with the removable card being inserted to interact with the stationary board and the contacts being driven to move by actuators.
Figure 7:
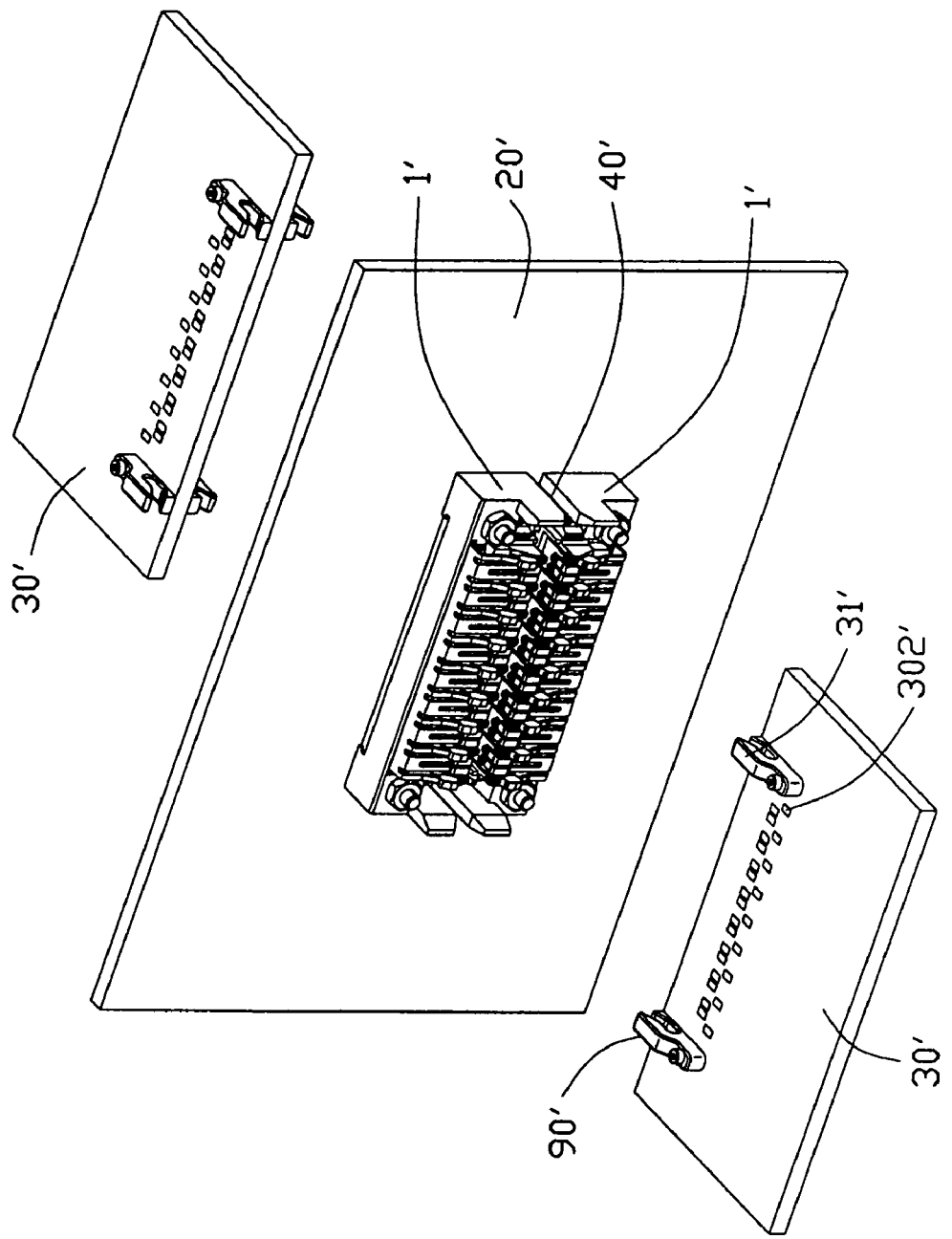
FIG. 7 is a perspective view showing an interconnection system in accordance with a second embodiment.
Figure 8:
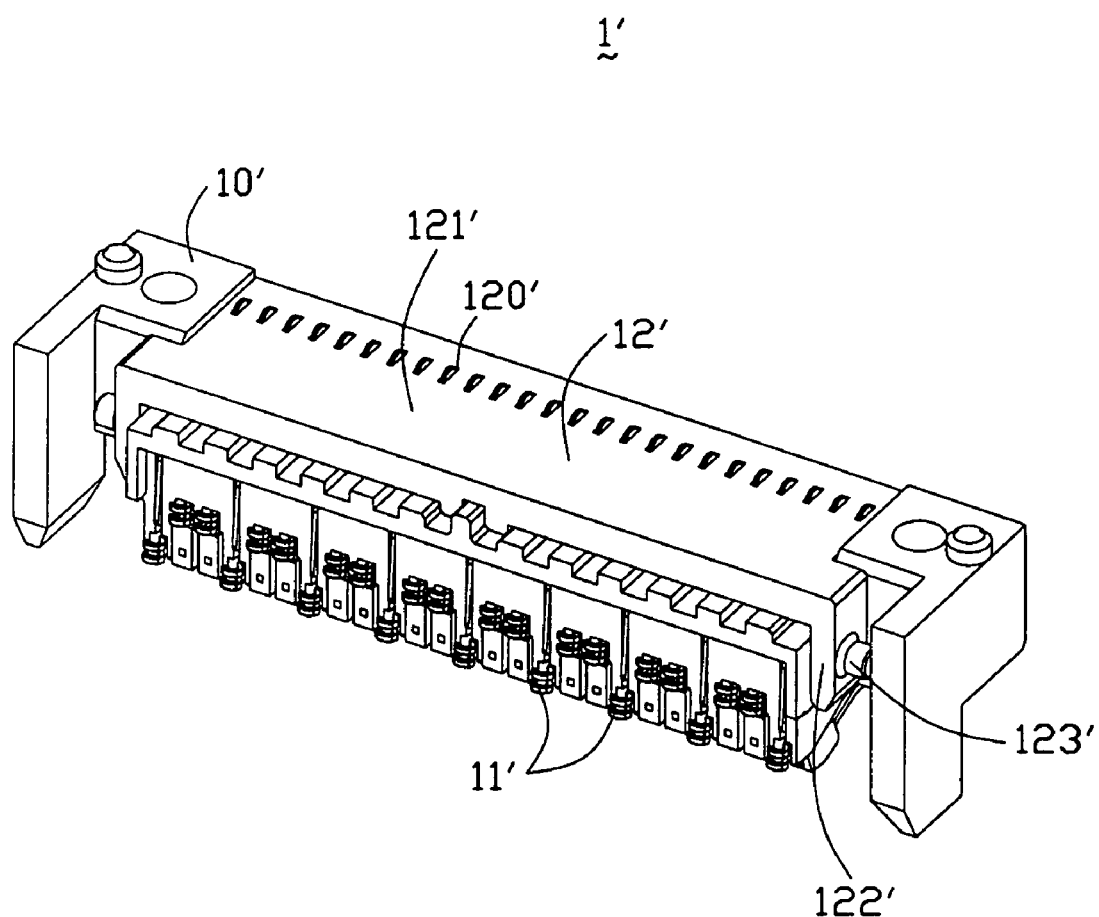
FIG. 8 is a perspective view of an electrical connector of the second embodiment.
Figure 9:
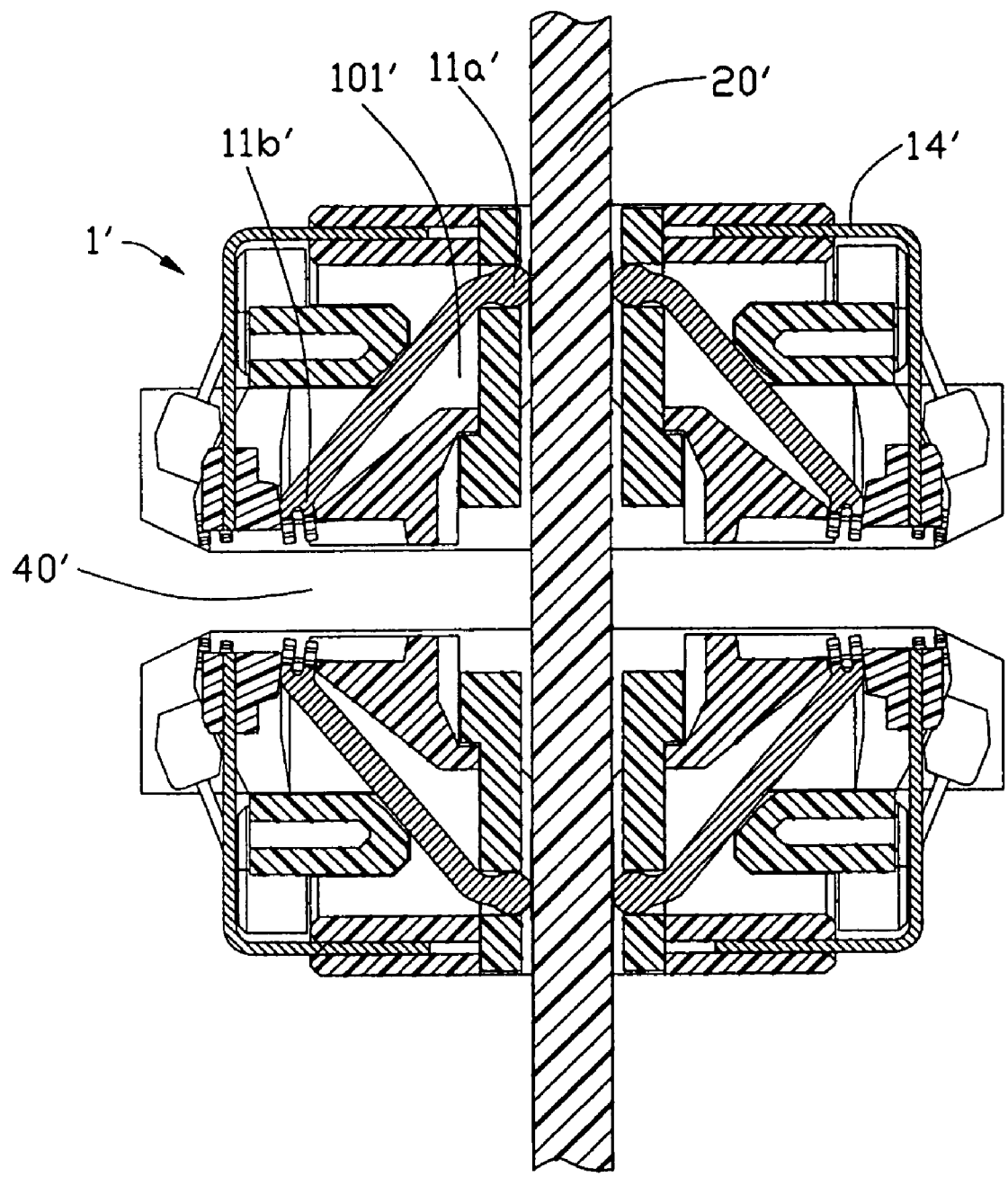
FIG. 9 is a cross-sectional view of electrical connectors of FIG. 8 mounted on a stationary board.
Figure 10:
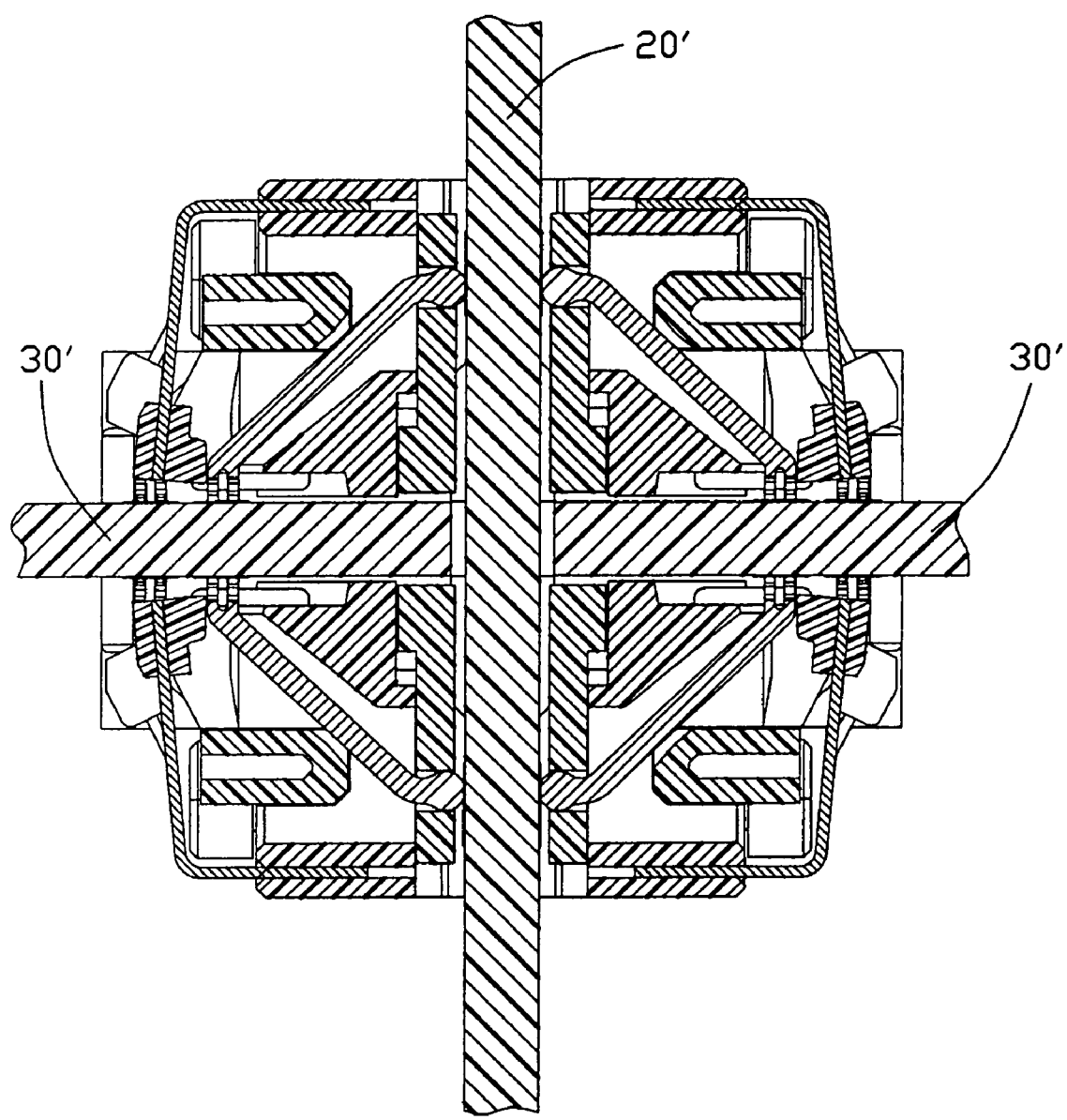
FIG. 10 is a cross-sectional view showing the removable card being inserted to interact with the stationary board and the contacts being driven to move by actuators of the second embodiment.

Accordingly, together referring to FIGS. 5 and 6, when the actuation plate 12 is driven to move transversely toward the removable card 30 along the mounting face 10a of the housing 10, the first contacting end 11a of the contact 11 is moved transversely with the actuator plate 12, while the second contact end 11b of the contact 11 moves away from the stationary board 20. As mentioned above, the biasing spring 14 provides a biasing force to the contact 11. When the contact 11 is moved with the actuator plate 12, the first contacting end 11a and the second contacting end 11b of the contact 11 provide a wiping contact with respect to corresponding conductive pads 202, 302 on the stationary board 20 and the removable card 30.

Figure 3:
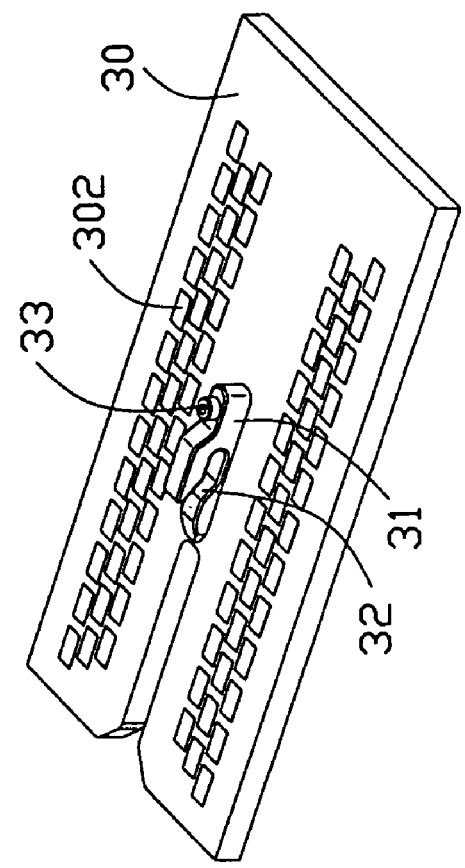
FIG. 3 is a perspective view showing the interconnection system in accordance with a first embodiment before the removable card is inserted into the stationary board.
Figure 3:
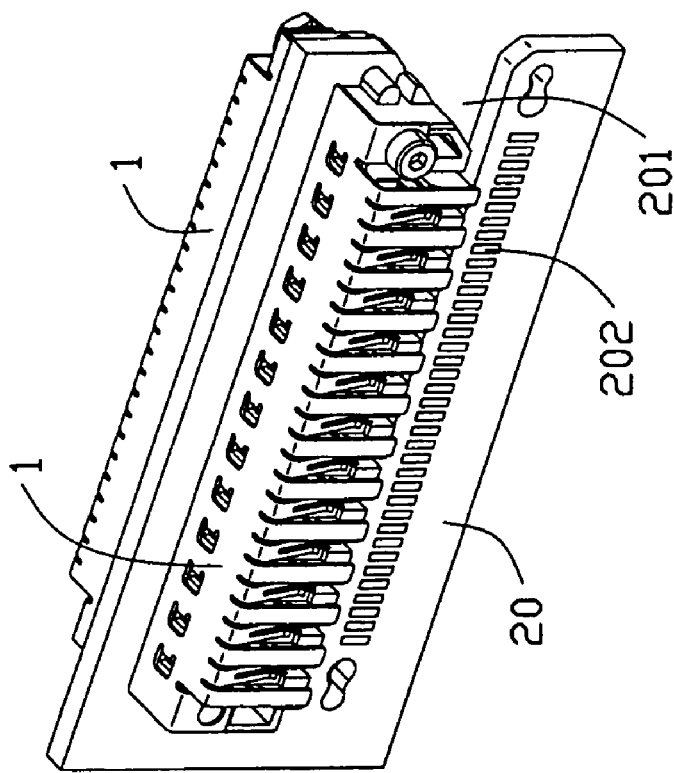
Figure 4:
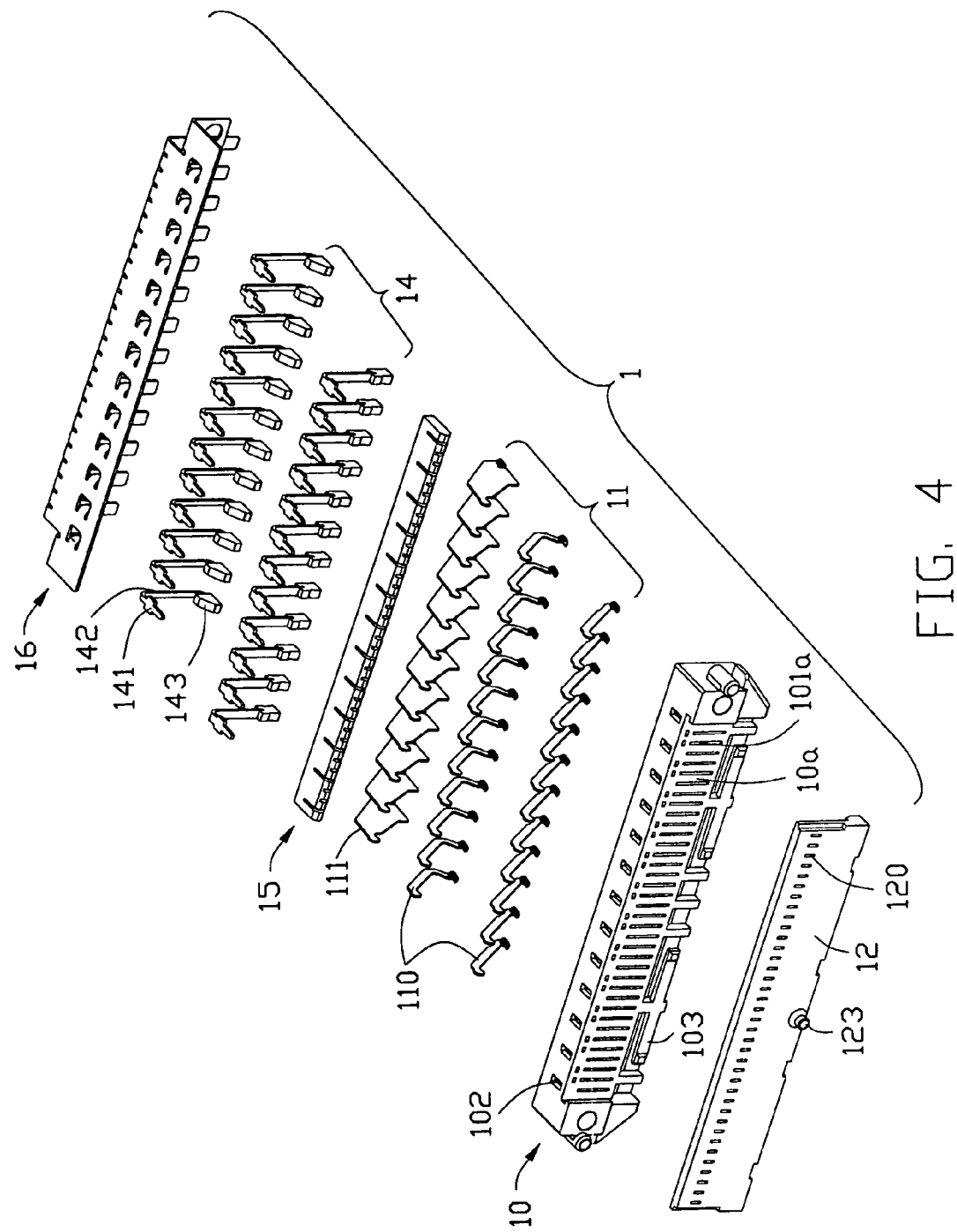
FIG. 4 is an exploded, perspective view of the connector shown in FIG. 3.

Turn to FIG. 3, the removable card 30 is provided with one cam member 31 on each surface thereof, which together with the actuation plate 12 forms an actuator 90 (FIG. 6) for facilitating the electrical connection between the two cards 20, 30. The cam member 31 defines thereon a slot 32 opened toward the stationary card 20. The slot 32 is defined in such a shape that, when the removable card 30 is inserted toward the stationary card 20 and received in the cutout 201, the post 123 of the actuation plate 12 slides within the slot 32 and moves close to the removable card 30. The cam 31 is secured on the removable card 30 by a screw 33. Understandably, other structures or elements or methods are also applicable for firmly assembling the cam 31 on the removable card 30. Further, in the preferred embodiment, one screw 33 is used to secure two cam members 31 located oppositely on said removable card 30. The two cam members 31 can be cooperated with corresponding posts 123 of different connectors 1 mounted on opposite sides of the cutout 201 of the stationary card 20.

The electrical connector 1 further includes a spacer 15 and a metal shell 16 attached to the housing 10. The shell 16 comprises a plurality of tabs 161 stamped therefrom for engagement with corresponding slits 102 defined in a surface of the housing 10 to retaining the shell 16 on the housing 10. The housing 10 is also provided with a pair of latches 103 abutting against the actuation plate 12. Moreover, in the preferred embodiment, the connectors are bolt down to stationary card prior to card mating.

FIGS. 5 and 6 illustrate the movement of the contact 11 within the passageway 101 of the housing 10 when the actuator 90 is actuated. As shown in FIG. 5, the connectors 1 are securely mounted on the stationary board 20 with the first contact ends 11a of the contacts 11 electrically contacting with the corresponding conductive pads 202 of the stationary board 20. In this position, the second contact end 11b of the contact 11 is located in a lowest position within the passageway 101 and the spring arm 142 is substantially parallel to the stationary card 20 (FIG. 5).

When a forward edge of the removable card 30 is inserted into the cutout 201 of the stationary card 20, the post 123 of the actuation plate 12 is engaged with the cam member 31 and moves along the slot 32. With the sliding of the post 123 in the slot 32, the post 123 moves close to the removable card 30 and the actuation plate 12 is driven to move transversely along the mounting face 10a of the housing 10. The first contact end 11a of the contact moves together with the actuation plate 12 and slides on the corresponding conductive pad 202 of the stationary board 20. Simultaneously, the second contact end 11b of the contact 11 is pushed upwardly and contacts with the corresponding conductive pad 302 of the inserted removable card 30. Accordingly, an electrical connection between the two boards 20, 30 is established through the connector 1.

As clearly shown in FIG. 6, the movement direction of the first contacting end 11a of the contact 11 is perpendicularly to the movement direction of the second contacting end 11b of the contact 11. The profile of the cam member 31 allows the contacts to be disengaged from the removable card during most of the insertion distance and engage the conductive pads 302 of the removable card 30 during the final card mating distance. The actuation of the connector 1 is completed when the card is mated in the final position. Particularly, there is no secondary operation to actuate the connector 1 in the present invention. The contacts 11 are disengaged or re-actuated when the card is pulled out by the shape of the cam member 31. In the preferred embodiment, a pair of cam members 31 are provided on opposite sides of the removable card 30 and cooperate with the posts on four connectors (FIG. 6).

In the preferred first embodiment, the shape of the conductive pads of the removable card are rectangular and extending in a direction same to the insertion direction of the removable card. The second contact end of the contact could have a 90 degrees bend to allow mating wipe to occur in the card insertion direction.

It should be noted here that, in this preferred first embodiment, the first contacting ends of the contacts are arranged in one row and the second contacting ends of the contacts are arranged in three rows, each with a biasing spring. While, according to the application requirement, there may be two rows of first contact ends and three rows of second contact ends arranged in the housing and employed to transmit signal and ground, correspondingly. Other arrangements of the contacts are also applicable.

FIGS. 7-10 illustrate a second preferred embodiment of the present invention. In this embodiment, a removable card 30' is inserted to interact with a stationary board 20' along a direction vertical to a surface of the stationary board 20'. A pair of electrical connectors 1' are shown mounted on the stationary board 20' and define therebetween a receiving slot 40' for receiving a forward edge of the removable card 30'.

Similarly, the electrical connector 1' of the second embodiment includes a dielectric housing 10' defining a plurality of passageways 101' slantedly extending therethrough. A plurality of signal and ground contacts 11' are movably received in corresponding passageways 101'. The signal contacts 11' can be differential pairs. Similar to the first embodiment, each contact 11' of the second embodiment comprises a first contact end 11a' for electrically connecting to corresponding conductive pad of the stationary board 20' and a second contact end 11b' for electrically connecting to corresponding conductive pad 302' of the removable card 30'. The first contact end 11a' is configured as a planar round head, while the second contact end 11b' is configured to have a pair of fingers bent perpendicularly for wiping purpose during insertion of the removable card 30'. Noted that the configurations of the signal contacts and the ground contacts can be changeable according to application requirement. In the second embodiment, the first contact ends 11a' are arranged in one row and the second contact ends 11b' are staggeredly arranged in two rows. Understandably, other arrangements of the contact are also fall in the scope of the present invention.

A plurality of biasing springs 14' are also provided in the second embodiment and each have a configuration and structure similar to those of the first embodiment. Detailed description is not illustrated here.

An actuator 90' of the second embodiment includes a U-shape actuation plate 12' assembled on the dielectric housing 10' and a driving or cam member 31' mounted on the removable card 30'. The U-shape actuation plate 12' comprises a longitudinal, planar main body 121' defining a row of holes 120' for retaining corresponding round heads of the first contact ends 11a'. A pair of side plates 122' extend perpendicularly from opposite side edges of the main body 121', each provided thereon a post 123'. The cam member 31' has a same structure to that of the first embodiment and the cooperation between the cam member 31' and the post 123' is also same to those disclosed in the first embodiment. Detailed description is thereby omitted. It should be noted here that, in the second embodiment, one actuation plate 12' need to be cooperated with a pair of cam members 31'.

In the present invention, no secondary operation to actuate the connector is needed. The profile of the driving or cam member allows contacts to be disengaged from the card during most of the insertion distance and engaged the pads during the final card mating distance. The present invention has the connector and the actuation plate assembled together as an assembly, which is helpful for shipping. Also, the present invention allows for individual cards to disconnect from each other without disengaging entire row or column of connectors compared to the prior designs.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. An electrical interconnection system comprising:
   a first printed circuit board;
   a second printed circuit board;
   a driving member mounted on said second printed circuit board; and
   a connector mounted on said first printed circuit board, said connector comprising a plurality of contacts moveable in response to a driving force of the driving member to electrically interconnect said first and second circuit boards; further comprising an actuation plate mounted on said connector, wherein said driving member cooperates with said actuation plate to drive said contacts and wherein said actuation plate moves toward said second printed circuit board when said second circuit board is inserted to interact with said first circuit board.

2. An electrical interconnection system as described in claim 1, wherein said connector further comprises a spring member providing a retaining force to said contacts to retain said contacts in their original positions.

3. An electrical interconnection system as described in claim 1, wherein each contact has a first contact end and a second contact end, and wherein said first contact end moves towards the second circuit board while said second contact end moves away from the first circuit board.

4. An electrical interconnection system as described in claim 3, wherein said actuation plate defines a plurality of insulated holes receiving said first contact ends.

5. An electrical interconnection system as described in claim 3, wherein said actuation plate has a post projecting therefrom along a direction parallel to said second circuit board.

6. An electrical interconnection system as described in claim 5, wherein said driving member defines a slot slideably receiving the post, and wherein said slot is shaped in such a manner that the post moves close to said second circuit board when said second circuit board is inserted towards said first circuit board.

7. An electrical interconnection system as described in claim 6, wherein the second circuit board is moved towards said first circuit board along a lengthwise direction of said connector.

8. An electrical interconnection system as described in claim 1, wherein said actuation plate is formed in a U-shape.

9. An electrical interconnection system as described in claim 8, wherein said post is formed on a lateral side of said actuation plate.

10. An electrical interconnection system as described in claim 9, wherein the second circuit board is moved towards said first circuit board along a transverse direction of said connector.

11. An electrical interconnection system as described in claim 1, wherein said connector comprises a first surface facing said first printed circuit board and a second surface facing said second printed circuit board, and wherein said connector defines a plurality of passageways extending between said first and said second surfaces for receiving corresponding contacts.

12. An electrical interconnection system as described in claim 11, wherein said actuation plate is movably assembled to said first surface.

13. An electrical interconnection system comprising:
    a first circuit board having a plurality of first conductive pads;
    a second circuit board having a plurality of second conductive pads;
    a connector mounted on said first circuit board and comprising a plurality of contacts; and
    an actuation plate situated between said connector and said first printed circuit board and receiving a respective portion of each contact, said actuation plate being movable in response to a cross connection of the second circuit board relative to the first circuit board to move the contacts to electrically interconnect the first and the second conductive pads.

14. An electrical interconnection system as described in claim 13, further comprising a driving member mounted on said second printed circuit board.

15. An electrical interconnection system as described in claim 14, wherein said actuation plate forms a post, and wherein said driving member defines a slot receiving said post, and wherein said post moves within said slot towards said second circuit board.

16. A method for electrically interconnecting two printed circuit boards, comprising the steps of:

providing at least one connector on a first circuit board, said at least one connector comprising a plurality of contacts;

providing a driving member on a second circuit board; and moving said first and said second printed circuit boards relative to each other to enable the driving member to drive the at least one connector; wherein the step of moving comprises actuating a respective plate of said at least one connector to move a respective end of each of said contacts.

17. A method for electrically interconnecting two printed circuit boards as defined in claim 16, wherein the step of moving comprises moving said respective ends of the contacts toward said second printed circuit board.

* * * * *